United States Patent
Cho et al.

(10) Patent No.: US 9,129,811 B2
(45) Date of Patent: Sep. 8, 2015

(54) METHOD AND BOARD FOR GROWING HIGH-QUALITY GRAPHENE LAYER USING HIGH PRESSURE ANNEALING

(71) Applicant: Korea Advanced Institute of Science and Technology, Daejeon (KR)

(72) Inventors: Byung Jin Cho, Daejeon (KR); Jeong Hun Mun, Daejeon (KR)

(73) Assignee: Korea Advanced Instittute of Science and Technology, Daejeon (KR)

( * ) Notice: Subject to any disclaimer, the term of this patent is extended or adjusted under 35 U.S.C. 154(b) by 0 days.

(21) Appl. No.: 14/132,071

(22) Filed: Dec. 18, 2013

(65) Prior Publication Data

US 2014/0299975 A1 Oct. 9, 2014

(30) Foreign Application Priority Data

Apr. 5, 2013 (KR) ........................ 10-2013-0037436

(51) Int. Cl.
*H01L 21/20* (2006.01)
*H01L 21/02* (2006.01)
*H01L 29/16* (2006.01)
*H01L 45/00* (2006.01)

(52) U.S. Cl.
CPC ...... *H01L 21/02664* (2013.01); *H01L 21/0262* (2013.01); *H01L 21/02381* (2013.01); *H01L 21/02488* (2013.01); *H01L 21/02491* (2013.01); *H01L 21/02502* (2013.01); *H01L 21/02527* (2013.01); *H01L 21/02645* (2013.01); *H01L 21/02658* (2013.01); *H01L 29/1606* (2013.01); *H01L 45/1616* (2013.01)

(58) Field of Classification Search
CPC ..................... H01L 29/1606; H01L 21/02645; H01L 45/1616
USPC .................................. 257/629; 438/478, 479
See application file for complete search history.

(56) References Cited

U.S. PATENT DOCUMENTS

| 8,637,118 | B2 | 1/2014 | Zenasni |
| 8,916,013 | B2 | 12/2014 | Hong et al. |
| 2013/0001515 | A1* | 1/2013 | Li et al. ............................ 257/24 |
| 2013/0287956 | A1* | 10/2013 | Patil .............................. 427/333 |

FOREIGN PATENT DOCUMENTS

| JP | 200991174 A | 4/2009 |
| KR | 1020100107403 A | 10/2010 |
| KR | 1020120083864 A | 7/2012 |
| KR | 1020120111400 A | 10/2012 |
| WO | 2011021715 A1 | 2/2011 |

* cited by examiner

*Primary Examiner* — Marcos D. Pizarro
*Assistant Examiner* — Tifney Skyles
(74) *Attorney, Agent, or Firm* — The Webb Law Firm

(57) ABSTRACT

This invention relates to a method and board for forming a graphene layer, and more particularly, to a method of forming a high-quality graphene layer using high pressure annealing and to a board used therein. The method of forming the graphene layer includes forming a reaction barrier layer on a substrate layer, forming a metal catalyst layer which functions as a catalyst for forming the graphene layer on the reaction barrier layer, subjecting a board including a stack of the layers to high pressure annealing, and growing the graphene layer on the metal catalyst layer. This board is subjected to high pressure annealing before growth of the graphene layer, and the reaction barrier layer is formed using a material having high adhesion energy to the metal catalyst layer so as to suppress migration of metal catalyst atoms.

10 Claims, 6 Drawing Sheets

METHOD AND BOARD FOR GROWING HIGH-QUALITY GRAPHENE LAYER USING HIGH PRESSURE ANNEALING

CROSS-REFERENCE TO RELATED APPLICATIONS

This application claims priority to Korean Patent Application No. 10-2013-0037436 filed on Apr. 5, 2013, the disclosure of which is hereby incorporated by reference in its entirety.

BACKGROUND OF THE INVENTION

1. Field of the Invention

The present invention relates to a method and board for forming a graphene layer, and, more particularly, to a method of forming a high-quality graphene layer using high pressure annealing and to a board used therein.

2. Description of the Related Art Graphene is a two-dimensional (2D) thin film resulting from planar arrangement of carbon atoms, and has a variety of advantages, including high electronic mobility, excellent mechanical strength, high transparency, etc. Furthermore, graphene may be currently manufactured using a processing technique such as deposition, etc., which is typically used, and is thus receiving attention as a next-generation material.

A graphene layer having the above properties is conventionally formed in such a manner that a silicon carbide (SiC) board is annealed at a high temperature in a high vacuum or that graphite oxide dispersed in a solvent is reduced. Recently, formation of a graphene layer using chemical vapor deposition (CVD) is mainly utilized due to its ability to form a graphene layer having a large area at low cost.

The method of forming a graphene layer using CVD refers to a method of growing graphene by allowing a hydrocarbon-based gas to flow while heating a catalyst metal such as nickel (Ni), copper (Cu), etc. to a high temperature. Recently, a method of growing a graphene layer on a metal thin film by exposing a copper (Cu) board to a high temperature of about 900~1000° C. while allowing methane ($CH_4$) gas to flow to the board is mainly employed. However, this method is problematic because the surface of copper becomes essentially severely rough after a high temperature process due to the low melting point of copper (1084° C.).

For example, when a copper metal thin film having a thickness of 300 nm is heated at 1000° C. for 10 min to grow graphene, the depth of the grain boundary thereof is known to exceed 100 nm, and thereby a graphene layer in monolayer form is grown thereon along the curvature of about 100 nm, thus forming a structure having a three-dimensional (3D) curvature. The graphene layer thus grown is utilized by being transferred to a silicon wafer having silicon oxide or an insulating wafer such as glass. As such, while the graphene layer grown along the grain boundary of metal is transferred to a planar wafer, it is mechanically pressed and thus wrinkles are formed on the planar structure of the graphene layer.

In order to prevent damage to the graphene layer during transfer of the graphene layer grown on metal to the insulating wafer, a protective layer is formed from PMMA (Polymethyl methacrylate) using spin coating. In this procedure, as PMMA is applied to be thicker on the curvature formed at the grain boundary of the metal thin film, such PMMA is not completely removed in a PMMA removal process after the transfer process and is thus left behind as a residue. The PMMA residue thus formed partially dopes the graphene layer.

Such wrinkles and residue are very randomly distributed, and may degrade the properties of a graphene device made using the graphene layer, and for example, problems such as low Dirac voltage uniformity of a graphene device, low carrier mobility, low on/off ratio, etc. are caused.

SUMMARY OF THE INVENTION

Accordingly, the present invention has been made keeping in mind the above problems encountered in the related art, and an object of the present invention is to provide a method and board for forming a high-quality graphene layer, wherein superior surface flatness of a metal thin film may be maintained even when a high temperature process necessary for growing a graphene layer is carried out.

In order to accomplish the above object, an aspect of the present invention provides a method of forming a graphene layer, comprising (a) forming a reaction barrier layer on a substrate layer; (b) forming a metal catalyst layer which functions as a catalyst for forming the graphene layer on the reaction barrier layer; (c) subjecting a board comprising a stack of the layers to high pressure annealing; and (d) growing the graphene layer on the metal catalyst layer.

As such, (c) may be performed by conducting annealing while applying the pressure generated from a pressurizer to the board from above and below.

The pressurizer may comprise an upper press; a lower press configured to apply the pressure upwards or to support the pressure applied from the upper press; and a pressure generator configured to generate the pressure so that the upper press and the lower press are driven by the generated pressure, wherein the upper press is configured to apply the pressure downwards or to support the pressure applied from the lower press.

Also, (c) may be performed in a vacuum atmosphere or in an inert gas atmosphere.

The metal catalyst layer may be a copper (Cu) metal catalyst layer or a metal catalyst layer having intrinsic stress less than or equal to that of the copper (Cu) metal catalyst layer.

The metal catalyst layer may comprise any one selected from among copper (Cu), titanium (Ti) and silver (Ag).

The reaction barrier layer may be a silicon dioxide ($SiO_2$) reaction barrier layer or a reaction barrier layer having adhesion energy to the metal catalyst layer greater than or equal to that of the silicon dioxide ($SiO_2$) reaction barrier layer.

The reaction barrier layer may comprise any one selected from among silicon dioxide ($SiO_2$), titanium nitride (TiN) and tantalum nitride (TaN).

The substrate layer may comprise any one selected from among silicon (Si), germanium (Ge) and silicon germanium (SiGe), or may comprise silicon on insulator (SOI).

Also, growing the graphene layer in (d) may be performed using CVD.

Another aspect of the present invention provides a board for forming a graphene layer, comprising a substrate layer; a metal catalyst layer disposed on the substrate layer and functioning as a catalyst for forming the graphene layer; and a reaction barrier layer disposed between the substrate layer and the metal catalyst layer so as to prevent formation of a compound between the metal catalyst layer and the substrate layer, wherein the metal catalyst layer has superior surface flatness because of high pressure annealing even when a high temperature process for forming the graphene layer is performed, compared to the case where high pressure annealing is not performed.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

The present invention may be modified variously and may have a variety of embodiments, and below is a detailed description of specific embodiments with reference to the appended drawings.

In the following description, it is noted that, when the detailed description of known techniques related with the present invention may make the gist of the present invention unclear, a detailed description thereof will be omitted.

Further, in the following description, the terms "first", "second" and the like may be used to explain various elements, and are used to differentiate a certain element from other elements, but the configuration of such elements should not be construed to be limited by the terms.

Conventionally, when a high temperature process is performed to form a graphene layer, the surface of a metal catalyst layer 130 is roughened and thereby the quality of the graphene layer which is grown on the metal catalyst layer 130 degrades. Hence, in the present invention, a board subjected to high pressure annealing is used to form a graphene layer so that surface flatness of the metal catalyst layer 130 may be maintained even when a high temperature process is carried out.

Figure 1:
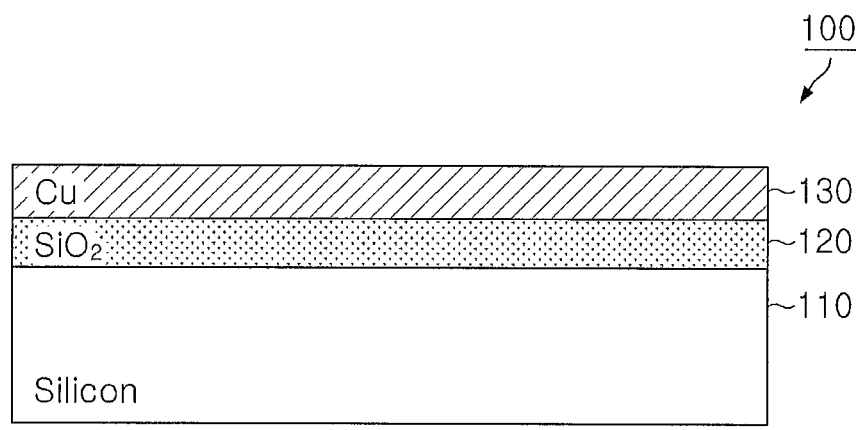
FIG. 1 is a schematic view illustrating the configuration of a board subjected to high pressure annealing for forming a graphene layer according to an embodiment of the present invention.

FIG. 1 illustrates the configuration of a board 100 subjected to high pressure annealing to form a graphene layer according to an embodiment of the present invention. As illustrated in FIG. 1, the board 100 for forming a graphene layer according to an embodiment of the present invention is configured such that a substrate layer 110 is provided and a reaction barrier layer 120 and a metal catalyst layer 130 are sequentially stacked thereon.

As such, graphene refers to a 2D thin film comprising a monolayer of carbon atoms arranged in a hexagonal network, and a graphene layer indicates a layer which is composed of graphene and is formed on a board via a series of processes.

In the present invention, a high pressure annealing process refers a process which is performed in such a manner that annealing is performed to improve crystallinity of the metal catalyst layer 130 and high pressure is simultaneously applied to the board 100 from above and below, thereby improving densification of the structure of the metal catalyst layer 130.

The substrate layer 110 is a basis layer necessary for performing a series of processes, and may be mainly formed of silicon, and may be made using germanium (Ge), silicon germanium (SiGe) or silicon on insulator (SOI), as required.

Provided on the substrate layer 110 is the reaction barrier layer 120. In the case where the substrate layer 110 reacts with the metal catalyst layer 130 and thus forms a compound such as metal silicide, etc., the surface roughness of the metal catalyst layer 130 and the properties of the graphene layer may become poor, and thus the reaction barrier layer 120 should be disposed between the substrate layer 110 and the metal catalyst layer 130 so as to prevent the reaction between the substrate layer 110 and the metal catalyst layer 130.

Also, as the reaction barrier layer 120 applies high adhesion energy to the metal catalyst layer 130, it plays a role in suppressing the migration of metal atoms of the metal catalyst layer 130. Even when the metal catalyst layer 130 is subjected to a high temperature process for growing a graphene layer, so high adhesion energy enables high surface flatness of the metal catalyst layer to be maintained, and thereby 3D curvature of the graphene layer grown on the metal catalyst layer 130 and wrinkles due thereto may be minimized, ultimately forming a high-quality graphene layer.

The material usable in forming the reaction barrier layer 120 includes silicon dioxide ($SiO_2$), titanium nitride (TiN), tantalum nitride (TaN), etc., which have high adhesion energy to the metal of the metal catalyst layer 130 while preventing formation of a compound between the substrate layer 110 and the metal catalyst layer 130. The adhesion energy of the reaction barrier layer 120 to the metal catalyst layer 130 enables the migration of metal atoms of the metal catalyst layer 130 to be suppressed, so that high surface flatness of the metal catalyst layer 130 may be maintained even when a high temperature process for forming a graphene layer is performed. This adhesion energy varies depending on the kind and thickness of the materials of the metal catalyst layer 130 and the reaction barrier layer 120. When any material has higher adhesion energy to a specific metal than that of the board including a reaction barrier layer 120 of silicon dioxide ($SiO_2$), it may sufficiently suppress the migration of corresponding metal atoms and is thus useful as the material for the reaction barrier layer 120.

The metal catalyst layer 130 functions as a catalyst for forming the graphene layer, and may be provided in the form of a metal thin film. The metal for the metal catalyst layer 130 should have low intrinsic stress. This is because the adhesion energy of the reaction barrier layer 120 to the metal catalyst layer 130 is large, and thus when metal having high intrinsic stress such as nickel (Ni), cobalt (Co), iron (Fe), etc. is used, stress induced grain growth is enhanced, undesirably increasing the surface roughness of metal. Hence, the metal for the metal catalyst layer 130 preferably includes copper (Cu), silver (Ag), titanium (Ti), etc., having low intrinsic stress. In the case where intrinsic stress of a metal is measured under the same conditions, the metal may be typically classified into a high intrinsic stress group and a low intrinsic stress group. When a metal having lower intrinsic stress than that of copper (Cu) is used, it does not incur problems in terms of intrinsic stress induced grain growth and may thus be used for the metal catalyst layer 130.

Through high pressure annealing, the structure of the metal catalyst layer 130 is improved in crystallinity and densification. Accordingly, even when a high temperature process for forming a graphene layer is performed, the surface of the metal catalyst layer 130 may be suppressed from being roughened. Moreover, because of the adhesion energy of the reaction barrier layer 120 to the metal catalyst layer 130, the migration of metal atoms is decreased. Accordingly, even when a high temperature process for forming a graphene layer is performed, the surface of the metal catalyst layer 130 may be suppressed from being roughened. As the metal catalyst layer 130 becomes thinner, the above effects are obviously exhibited.

Figure 2:
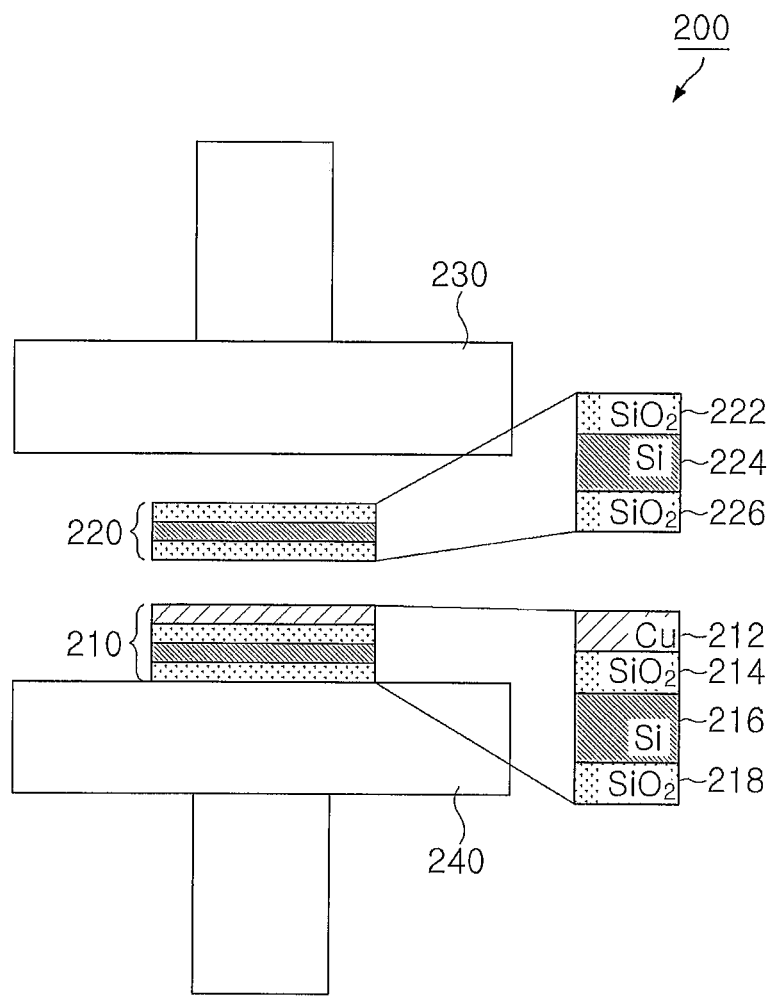
FIG. 2 is a schematic view illustrating a high pressure annealing process according to an embodiment of the present invention.

FIG. 2 illustrates the high pressure annealing process 200 according to an embodiment of the present invention.

A sample 210 is placed on the lower press 240 of a pressurizer, and a board 220 including a reaction barrier layer 226 such as a silicon dioxide ($SiO_2$) film 226 is placed on the sample 210 so that the surface of a metal catalyst layer 212 is not damaged by the rough surface of the upper press 230, followed by performing annealing while applying pressure generated from a pressure generator to the upper and lower presses 230, 240 in a vacuum atmosphere. For example, in the case where a board 210, configured such that a copper metal thin film 212 as a metal catalyst is disposed on a silicon (Si) substrate 216 including a silicon oxide ($SiO_2$) film 214 as the reaction barrier layer, is subjected to high pressure annealing, high pressure annealing is carried out in a state of a silicon substrate 224 having a silicon oxide ($SiO_2$) film 226 being placed on the board 210 so that the silicon oxide film 226 comes into contact with the copper metal thin film 212. In this case, with the goal of protecting the boards, silicon oxide films 218, 222 may be formed on the surfaces of the boards 210, 220 which come into contact with the upper and lower presses 230, 240.

Figure 3:
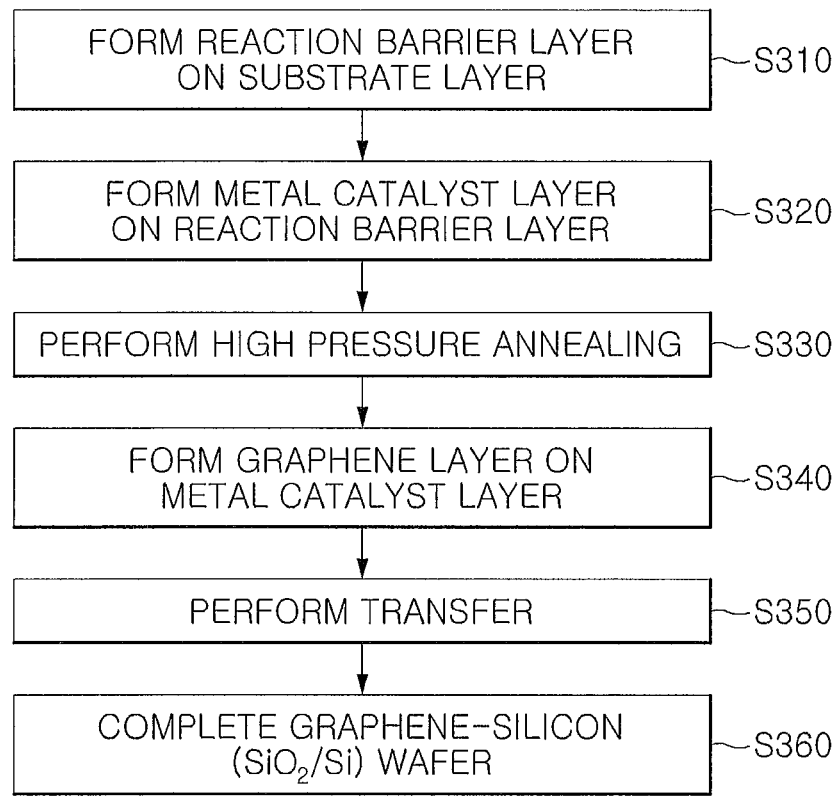
FIG. 3 is a flowchart illustrating a process of manufacturing a graphene-silicon (graphene on $SiO_2$/Si) wafer using a high pressure annealing process according to an embodiment of the present invention.

FIG. 3 illustrates the flowchart of the process of manufacturing a graphene-silicon (graphene on $SiO_2$/Si) wafer using high pressure annealing according to an embodiment of the present invention. As illustrated in FIG. 3, the process of forming the graphene layer using high pressure annealing includes forming a reaction barrier layer 120 on a substrate layer 110 (S310); forming a metal catalyst layer 130 on the reaction barrier layer 120 (S320); performing high pressure annealing (S330); growing a graphene layer on the metal catalyst layer 130 (S340); and transferring the grown graphene layer (S350), thus completing a graphene-silicon wafer (S360).

Specifically, the substrate layer 110 is prepared and then the reaction barrier layer 120 is formed thereon (S310). The substrate layer 110 may be formed of a material which is stable under high pressure annealing conditions, and the reaction barrier layer 120 may be formed using thermal oxidation, deposition, etc. Subsequently, the metal catalyst layer 130 is formed on the reaction barrier layer 120 (S320). The metal catalyst layer 130 is generally provided in the form of a metal thin film using a process such as deposition, etc.

Subsequently, high pressure annealing (S330) is performed in such a manner that an annealing process is conducted to improve crystallinity of the metal catalyst layer 130 and high pressure is simultaneously applied to the board 100 from above and below, thereby improving densification of the structure of the metal catalyst layer 130. As such, the optimal values of the process pressure and temperature may vary depending on the kind and thickness of the metal catalyst layer 130. In the case of the process pressure, a pressure of 30~50 MPa may be applied to the copper metal thin film having a thickness of 300 nm, but the optimal value thereof may vary depending on the kind and thickness of metal. For the process temperature and time, about 900° C. and 1 hr may be applied to the copper metal thin film having a thickness of 300 nm, but the optimal values thereof may vary depending on the kind and thickness of metal. In order to prevent oxidation of the metal catalyst layer 130, the process atmosphere is preferably set to a vacuum atmosphere of about $5 \times 10^{-6}$ Torr or less or to an inert gas atmosphere such as nitrogen ($N_2$) or argon (Ar).

When the board 100 for forming a graphene layer is completed in this way, the graphene layer is grown using the same (S340). The case where the graphene layer is formed using CVD according to an embodiment of the present invention is described below. Specifically, a metal thin film is heated to a high temperature in a hydrocarbon atmosphere under normal pressure so that a hydrocarbon gas is thermally decomposed, and the thermally decomposed carbon atoms are fused in the metal thin film and then cooled, whereby the oversaturated carbon atoms are segregated to the surface of the metal thin film, thus forming the graphene layer on the metal thin film.

The graphene layer formed on the metal thin film is typically transferred (S350) so as to facilitate the use thereof. The transfer process may be carried out variously, and may include, for example, forming a protective layer of PMMA (Polymethyl methacrylate) on the graphene layer using spin coating, etching the metal thin film to thus separate the graphene layer, transferring the graphene layer to a wafer such as silicon ($SiO_2$/Si) or the like, and removing the protective layer using acetone, etc.

In order to evaluate the properties of the board 100 for forming a graphene layer according to an embodiment of the present invention, a test board is manufactured in such a manner that the substrate layer 110 is made of silicon (Si), the reaction barrier layer 120 is formed to a thickness of 300 nm using thermal oxidation of silicon dioxide ($SiO_2$), and the metal catalyst layer 130 is deposited to a thickness of 300 nm on the reaction barrier layer 120 using copper (Cu). The manufactured board is subjected to high pressure annealing in a vacuum atmosphere of about $5 \times 10^{-6}$ Torr at 900° C. for 1 hr while maintaining a pressure of 30 MPa. The board thus obtained is used as each measurement sample of FIGS. 4 to 6.

The sample subjected to high pressure annealing undergoes CVD in order to grow the graphene layer. As such, the process temperature is set to 950° C., and surface treatment is performed for 10 min in a hydrogen gas atmosphere of 1 atm after which the graphene layer is grown while allowing methane ($CH_4$) to flow for 3 min. The sample having the grown graphene layer is transferred to a silicon ($SiO_2$/Si) wafer having a silicon oxide film with a thickness of 300 nm in order to analyze the properties thereof.

Figure 4:
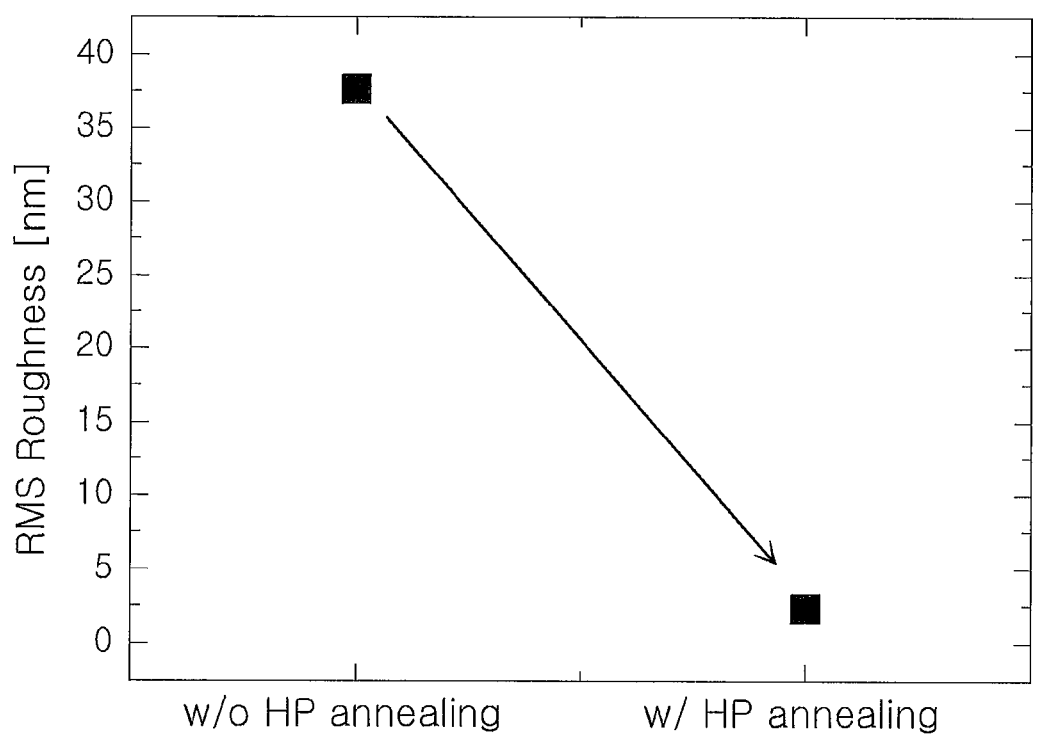
FIG. 4 is a graph illustrating surface roughness (RMS roughness) of a metal catalyst layer after growth of a graphene layer according to an embodiment of the present invention.

FIG. 4 is a graph illustrating the results of atomic force microscopy of surface roughness of the metal catalyst layer 130 after growth of the graphene layer under the same conditions with respect to the sample (w/HP annealing of FIG. 4) subjected to high pressure annealing and the sample (w/o HP annealing of FIG. 4) not subjected to high pressure annealing. In the case of the sample not subjected to high pressure annealing, its surface roughness is measured to be 37.7 nm, and the surface roughness of the sample subjected to high pressure annealing is 2.35 nm, which is decreased to about 1/16. Thus, high pressure annealing is effective at enabling the Cu thin film to have uniform surface flatness even in the subsequent high temperature process.

Figure 5:
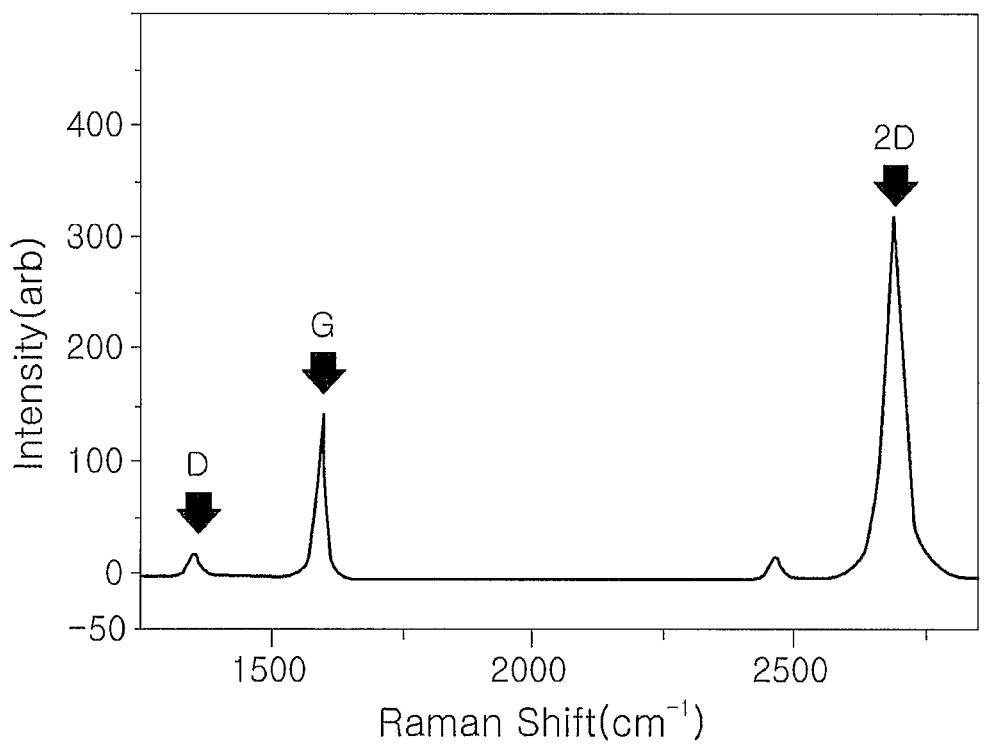
FIG. 5 is a graph illustrating Raman spectra for evaluating the quality of the graphene layer transferred to a silicon ($SiO_2$/Si) wafer according to an embodiment of the present invention.

FIG. 5 is a graph illustrating the results of Raman spectroscopy of quality of the graphene layer transferred to the silicon ($SiO_2$/Si) wafer according to an embodiment of the present invention. As such, Raman spectroscopy is a kind of optical analysis for analyzing properties of a material by measuring non-elastic scattered light having energy different from that of incident light among light rays scattered after having been radiated onto a specific material. The formed graphene layer is transferred to the oxide film having a thickness of 300 nm and then its quality is measured.

As illustrated in FIG. 5, the D band which shows the defects of the graphene layer is very small, and the size ratio of the G band and the 2D band is about 0.5, which indicates the grown graphene layer is a high-quality monolayer.

Figure 6:
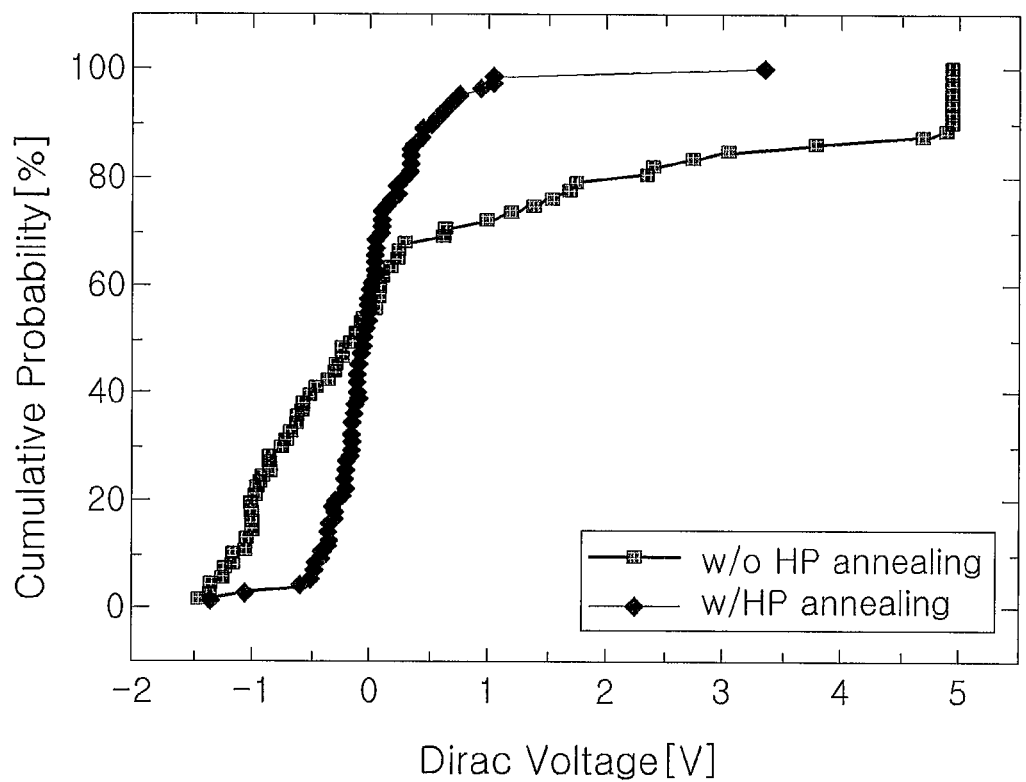
FIG. 6 is a graph illustrating Dirac voltage of a top-gate device including the graphene layer according to an embodiment of the present invention.

FIG. 6 is a graph illustrating the results of measurement of Dirac voltage distribution of a top-gate device including the graphene layer according to an embodiment of the present invention. The method of forming the graphene layer using high pressure annealing according to the present invention enables surface flatness of the metal catalyst layer 130 to be improved to thereby reduce the formation of wrinkles on the graphene layer, which is regarded as uniformity of Dirac voltage distribution.

As illustrated in FIG. 6, in the case of the graphene layer grown using high pressure annealing (w/HP annealing of FIG. 6), Dirac voltage is closely and very uniformly distributed at 0 V unlike the case without performing high pressure annealing (w/o HP annealing of FIG. 6). Thus, the uniform surface of metal through high pressure annealing can remarkably reduce the formation of wrinkles on graphene.

As described hereinbefore, the present invention provides a method and board for forming a high-quality graphene layer using high pressure annealing. According to the present invention, a board is subjected to high pressure annealing before growth of a graphene layer, thereby improving crystallinity of a metal catalyst layer and increasing densification thereof. Furthermore, a reaction barrier layer is formed using a material having high adhesion energy to the metal catalyst layer so as to suppress migration of metal catalyst atoms, and thus even when a high temperature process necessary for forming a graphene layer is performed, superior surface flatness of the metal catalyst layer can be maintained, consequently forming a high-quality graphene layer on the metal catalyst layer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Thus, the embodiments of the present invention do not limit the spirit of the invention but are construed to explain it. Furthermore, it is to be understood that the scope of protection of the invention is set forth by the following claims, and all the technical ideas within the range equivalent thereto are incorporated into the scope of the invention.

What is claimed is:

1. A method of forming a graphene layer, comprising:
    (a) forming a reaction barrier layer on a substrate layer;
    (b) forming a metal catalyst layer which functions as a catalyst for forming the graphene layer on the reaction barrier layer;
    (c) applying direct pressure to a board comprising a stack of the layers while simultaneously annealing the metal catalyst layer; and
    (d) growing the graphene layer on the metal catalyst layer,
    wherein (c) is performed by conducting annealing while applying a pressure generated from a pressurizer to the board from above using an upper press and from below using a lower press.

2. The method of claim 1, wherein the pressurizer comprises:
    the upper press;
    the lower press configured to apply the pressure upwards or to support the pressure applied from the upper press; and
    a pressure generator configured to generate the pressure so that the upper press and the lower press are driven by the generated pressure,
    wherein the upper press is configured to apply the pressure downwards or to support the pressure applied from the lower press.

3. The method of claim 1, wherein (c) is performed in a vacuum atmosphere or in an inert gas atmosphere.

4. The method of claim 1, wherein the metal catalyst layer is a copper (Cu) metal catalyst layer or a metal catalyst layer having intrinsic stress less than or equal to that of the copper (Cu) metal catalyst layer.

5. The method of claim 4, wherein the metal catalyst layer comprises any one selected from among copper (Cu), titanium (Ti) and silver (Ag).

6. The method of claim 1, wherein the reaction barrier layer is a silicon dioxide ($SiO_2$) reaction barrier layer or a reaction barrier layer having adhesion energy to the metal catalyst layer greater than or equal to that of the silicon dioxide ($SiO_2$) reaction barrier layer.

7. The method of claim 6, wherein the reaction barrier layer comprises any one selected from among silicon dioxide ($SiO_2$), titanium nitride (TiN) and tantalum nitride (TaN).

8. The method of claim 1, wherein the substrate layer comprises any one selected from among silicon (Si), germanium (Ge) and silicon germanium (SiGe), or comprises silicon on insulator (SOI).

9. The method of claim 1, wherein growing the graphene layer in (d) is performed using chemical vapor deposition.

10. A board for forming a graphene layer, comprising:
    a substrate layer;
    a metal catalyst layer disposed on the substrate layer and functioning as a catalyst for forming the graphene layer; and
    a reaction barrier layer disposed between the substrate layer and the metal catalyst layer so as to prevent formation of a compound between the metal catalyst layer and the substrate layer,
    wherein direct pressure is applied to the metal catalyst layer during annealing using a pressure generated from a pressurizer to the board from above using an upper press and from below using a lower press.

* * * * *